United States Patent
Lin et al.

(10) Patent No.: US 11,049,799 B1
(45) Date of Patent: Jun. 29, 2021

(54) SEMICONDUCTOR STRUCTURE AND METHOD FOR FORMING THE SAME

(71) Applicant: Vanguard International Semiconductor Corporation, Hsinchu (TW)

(72) Inventors: Yung-Fong Lin, Taoyuan (TW); Shin-Cheng Lin, Tainan (TW); Cheng-Wei Chou, Taoyuan (TW); Yu-Chieh Chou, Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/824,134

(22) Filed: Mar. 19, 2020

(51) Int. Cl.
  *H01L 23/48* (2006.01)
  *H01L 21/768* (2006.01)
  *H01L 29/66* (2006.01)
  *H01L 21/8232* (2006.01)
  *H01L 29/778* (2006.01)
  *H01L 29/06* (2006.01)
  *H01L 27/085* (2006.01)

(52) U.S. Cl.
  CPC ...... *H01L 23/481* (2013.01); *H01L 21/76843* (2013.01); *H01L 21/76885* (2013.01); *H01L 21/76898* (2013.01); *H01L 21/8232* (2013.01); *H01L 27/085* (2013.01); *H01L 29/0649* (2013.01); *H01L 29/66462* (2013.01); *H01L 29/778* (2013.01)

(58) Field of Classification Search
  CPC ............ H01L 23/481; H01L 21/76898; H01L 27/085; H01L 21/8232; H01L 29/0649; H01L 21/76885; H01L 29/778; H01L 29/66462; H01L 21/76843
  See application file for complete search history.

(56) References Cited

U.S. PATENT DOCUMENTS

| | | | |
|---|---|---|---|
| 9,583,465 B1* | 2/2017 | Cheng | H01L 23/481 |
| 2013/0260505 A1* | 10/2013 | Bedell | H01L 27/1203 438/67 |
| 2016/0133698 A1* | 5/2016 | Chou | H01L 21/76283 257/506 |
| 2018/0151474 A1* | 5/2018 | Chen | H01L 21/76898 |
| 2019/0067228 A1* | 2/2019 | Son | H01L 23/485 |
| 2020/0403090 A1* | 12/2020 | Lin | H01L 23/481 |

* cited by examiner

*Primary Examiner* — Robert G Bachner
(74) *Attorney, Agent, or Firm* — Birch, Stewart, Kolasch & Birch LLP

(57) ABSTRACT

A semiconductor structure and a method for forming the same are provided. A semiconductor structure includes a substrate, a seed layer on the substrate, an epitaxial layer on the seed layer, a first transistor on the epitaxial layer, an interlayer dielectric layer on the epitaxial layer, a dielectric pillar penetrating through the interlayer dielectric layer and the epitaxial layer, and a conductive liner disposed on a sidewall of the dielectric pillar. The conductive liner is electrically connected to the first transistor and the seed layer.

20 Claims, 8 Drawing Sheets

SEMICONDUCTOR STRUCTURE AND METHOD FOR FORMING THE SAME

BACKGROUND

Technical Field

The disclosure relates to semiconductor technology, and more particularly to a through hole in an insulating substrate.

Description of the Related Art

Gallium nitride-based (GaN-based) semiconductor materials have many excellent characteristics, such as high thermal resistance, a wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) devices and high-frequency devices, such as high electron mobility transistors (HEMT) with heterogeneous interfacial structures.

With the developments of GaN-based semiconductor materials, those semiconductor devices which use GaN-based semiconductor materials are used in demanding work environments, such as those with higher frequencies, higher temperatures, or higher pressure. Therefore, the semiconductor devices with GaN-based semiconductor materials still need further improvement to overcome various new challenges.

SUMMARY

Some embodiments of the present disclosure provide a semiconductor structure. The semiconductor structure includes a substrate, a seed layer on the substrate, an epitaxial layer on the seed layer, a first transistor on the epitaxial layer, an interlayer dielectric layer on the epitaxial layer, a dielectric pillar penetrating through the interlayer dielectric layer and the epitaxial layer, and a conductive liner on a sidewall of the dielectric pillar. The conductive liner is electrically connected to the first transistor and the seed layer.

Some embodiments of the present disclosure provide a method for forming a semiconductor structure. The method includes providing a substrate, forming a seed layer on the substrate, forming an epitaxial layer on the seed layer, forming a first transistor on the epitaxial layer, forming an interlayer dielectric layer on the epitaxial and covering the first transistor, forming a through hole penetrating through the interlayer dielectric layer and the epitaxial layer to expose a portion of a surface of the seed layer, forming a conductive liner on a sidewall of the through hole, and filling the through hole with a dielectric filler to form a dielectric pillar. The conductive liner is electrically connected to the first transistor and the seed layer.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1:
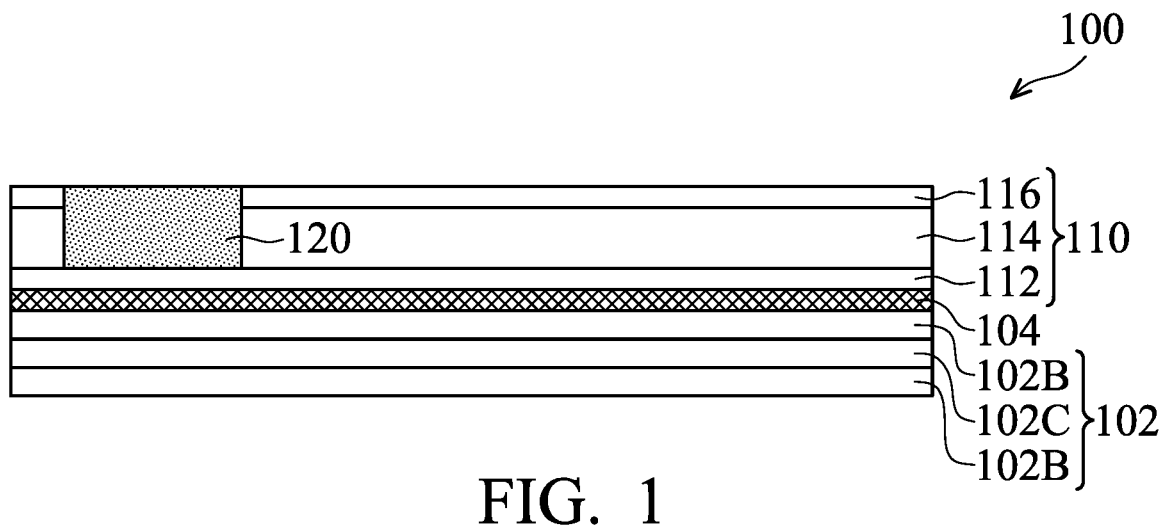
FIGS. 1-9 are cross-sectional views illustrating an exemplary semiconductor structure according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

Although some embodiments are discussed with steps performed in a particular order, these steps may be performed in another logical order. Additional features can be provided to the semiconductor structures in embodiments of the present disclosure. Some of the features described below can be replaced or eliminated for different embodiments.

During the operation of the high electron mobility transistors (HEMT), after high voltage is applied, the underlying seed layer in the devices is easily to produce defects due to the high voltage, thereby accumulating charges and thus affecting the operation of the overlying elements.

As a result, a semiconductor structure provided by embodiments of the present disclosure has a dielectric pillar and a conductive liner on a sidewall of the dielectric pillar, wherein the conductive liner is electrically connected to the seed layer on the substrate. By the above configuration, the dielectric pillar may isolate transistors from other conductive features, and the conductive liner may reduce the charge accumulation in the seed layer, thereby improving the performance of the semiconductor structure.

FIGS. 1-9 are cross-sectional views illustrating an exemplary semiconductor structure 100 according to some embodiments of the present disclosure. Referring to FIG. 1, a substrate 102 is provided. In some embodiments, the substrate 102 may be a single layer substrate, a multilayer substrate, a gradient substrate, other suitable substrate or the combination thereof or the like. The substrate 102 may be a semiconductor on an insulator (SOI) substrate, which may include a base material, a buried oxide layer on the base material, or a semiconductor layer on the buried oxide layer. In some embodiments, the substrate 102 includes a ceramic base material 102C and a blocking layer 102B on the ceramic base material 102C. In some embodiments, the substrate 102 includes a blocking layer 102B and a ceramic base material 102C between the blocking layers 102B.

In some embodiments, the ceramic base material includes a ceramic material. The ceramic material includes a metal inorganic material. In some embodiments, the ceramic base material 102C may include silicon carbide (SiC), aluminum nitride (AlN), sapphire, or another suitable material. The aforementioned sapphire base may include aluminum oxide. In some embodiments, the blocking layer 102B on the ceramic base layer 102C may include one or more layers of insulating material and/or another suitable material (such as a semiconductor layer). The insulating material layer may include an oxide, a nitride, an oxynitride, or another suitable material. The semiconductor layer may include polycrystalline silicon. The blocking layer 102B may prevent the ceramic base material 102C from diffusion and may block the ceramic base material 102C from interaction with other layers or process tools. In an embodiment, the blocking layer 102B encapsulates the ceramic base material 102C.

Next, still referring to FIG. 1, a seed layer 104 is formed on the substrate 102 and an epitaxial layer 110 is formed on the seed layer 104.

In some embodiments, the seed layer 104 is made of silicon (Si) or another suitable material. In some embodiments, the methods for forming the seed layer 104 include a selective epitaxial growth (SEG) process, a chemical vapor deposition (CVD) process, a molecular beam epitaxy (MBE) process, deposition of doped amorphous semiconductor (e.g., Si) followed by a solid-phase epitaxial recrystallization (SPER) step, methods of directly attaching seed crystals, or another suitable process. The CVD process may include a vapor-phase epitaxy (VPE) process, a low pressure CVD (LPCVD) process, an ultra-high vacuum CVD (UHV-CVD) process, or another suitable process.

In some embodiments, the epitaxial layer 110 includes a buffer layer 112 on the seed layer 104, a channel layer 112 on the buffer layer 112 and a barrier layer 116 on the channel layer 114.

In some embodiments, the buffer layer 112 is formed on the seed layer 104 using an epitaxial growth process. Formation of the buffer layer 112 may be helpful to mitigate the strain on the channel layer 114 that is subsequently formed on the buffer layer 112, and to prevent defects in the overlying channel layer 114. In some embodiments, the buffer layer 112 includes AlN, GaN, $Al_xGa_{1-x}N$ (wherein 0<x<1), a combination thereof, or the like. The buffer layer 112 may be formed using a process such as hydride vapor phase epitaxy (HVPE), molecular beam epitaxy (MBE), metal organic chemical vapor deposition (MOCVD), a combination thereof, or the like. Although the buffer layer 112 in the embodiment shown in FIG. 1 is a single layer, the buffer layer 112 may be a multilayered structure in other embodiments.

Next, a channel layer 114 is formed on the buffer layer 112 by an epitaxial growth process. In some embodiments, the channel layer 114 includes an undoped III-V group compound semiconductor material. For example, the channel layer 114 is made of undoped GaN, but the present disclosure is not limited thereto. In some other embodiments, the channel layer 114 includes AlGaN, AlN, GaAs, GaInP, AlGaAs, InP, InAlAs, InGaAs, other suitable III-V group compound materials, or a combination thereof. In some embodiments, the channel layer 114 is formed using a molecular-beam epitaxy method (MBE), a hydride vapor phase epitaxy method (HVPE), a metalorganic chemical vapor deposition method (MOCVD), other suitable methods, or a combination thereof.

Next, a barrier layer 116 is formed on the channel layer 114 by an epitaxial growth process. In some embodiments, the barrier layer 116 includes an undoped III-V group compound semiconductor material. For example, the barrier layer 116 includes undoped $Al_xGa_{1-x}N$ (wherein 0<x<1), but the present disclosure is not limited thereto. In some other embodiments, the barrier layer 116 includes GaN, AlN, GaAs, GaInP, AlGaAs, InP, InAlAs, InGaAs, other suitable III-V group compound materials, or a combination thereof. The barrier layer 116 may be formed using a molecular-beam epitaxy method (MBE), a metalorganic chemical vapor deposition method (MOCVD), a hydride vapor phase epitaxy method (HVPE), other suitable methods, or a combination thereof.

In some embodiments, the channel layer 114 and the barrier layer 116 include different materials from each other such that a heterojunction is formed between the channel layer 114 and the barrier layer 116. Therefore, a two-dimensional electron gas (2DEG) which is generated by a band gap between the hetero-materials may be formed at the interface between the channel layer 114 and the barrier layer 116. In some embodiments, the semiconductor structures, such as high electron mobility transistors (HEMT), may utilize 2DEG as conductive carriers. In some embodiments, the channel layer 114 may be a GaN layer, and the barrier layer 116 formed on the channel layer 114 may be an AlGaN layer, wherein the GaN layer and the AlGaN layer may be doped, such as with an n-type or a p-type dopant, or may have no dopant therein.

Also, in some embodiments, the epitaxial layer 110 is a GaN-containing composite layer. However, the present disclosure is not limited thereto. Besides the buffer layer 112, the channel layer 114 and the barrier layer 116, the epitaxial layer 110 may further include other films and/or layers. In some other embodiments, a carbon-doped layer is further formed between the buffer layer 112 and the channel layer 114 to increase the breakdown voltage of the semiconductor structure.

Next, still referring to FIG. 1, the isolation structure 120 may be formed in the epitaxial layer 110. In some embodiments, as shown in FIG. 1, the bottom surface of the isolation structure 120 may be level with the bottom surface of the channel layer 114. In other embodiments, the bottom surface of the isolation structure 120 may be in the buffer layer 112 included in the epitaxial layer 110 (not shown). In other embodiments, the bottom surface of the isolation structure 120 may be level with the bottom surface of the buffer layer 112 included in the epitaxial layer 110 (not shown). In some embodiments, by the formation of the isolation structure 120, the two-dimensional electron gas (2DEG) which is to be formed at a heterogeneous interface between the channel layer 114 and the buffer layer 116 may be isolated in order to prevent the two-dimensional electron gas (2DEG) in the channels of adjacent devices from shorting due to their connection.

In some embodiments, the isolation structure 120 may be formed by breaking a crystal lattice structure of the epitaxial layer 110 at a predetermined position by applying external energy, such as heating or irradiating, so that the epitaxial layer 110 in that position loses piezoelectricity and become nonconductive. In other embodiments, the isolation structure 120 may be formed by implanting a non-conductive element such as nitrogen (N), oxygen (O), or another suitable element into the epitaxial layer 110 (e.g. a gallium nitride layer) in order to break the crystal lattice structure of the epitaxial layer 110, thereby transforming the epitaxial layer 110 in the predetermined position into the isolation structure 120. In other embodiments, the materials of the isolation structure 120 may be dielectric materials, such as silicon oxide, silicon nitride, silicon oxynitride, aluminum oxide, the like, or a combination thereof. In this embodiment, the isolation structure 120 may be formed by forming a trench in the epitaxial layer 110 by an etching process, followed by filling a dielectric material into the trench using a deposition process.

Figure 2:
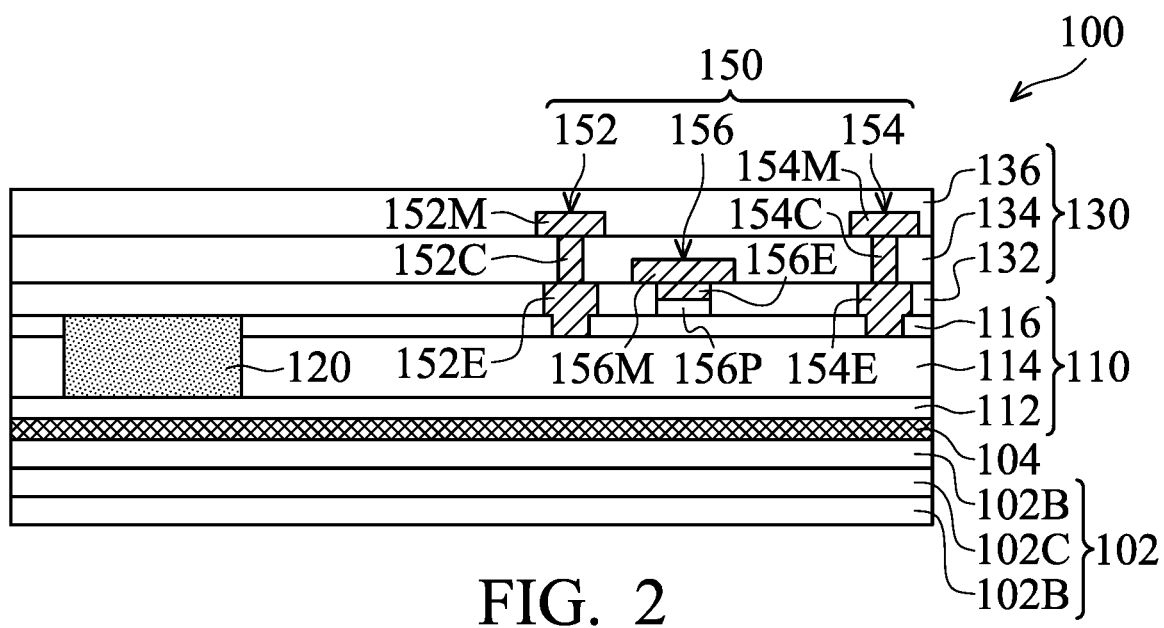
Figure 3:
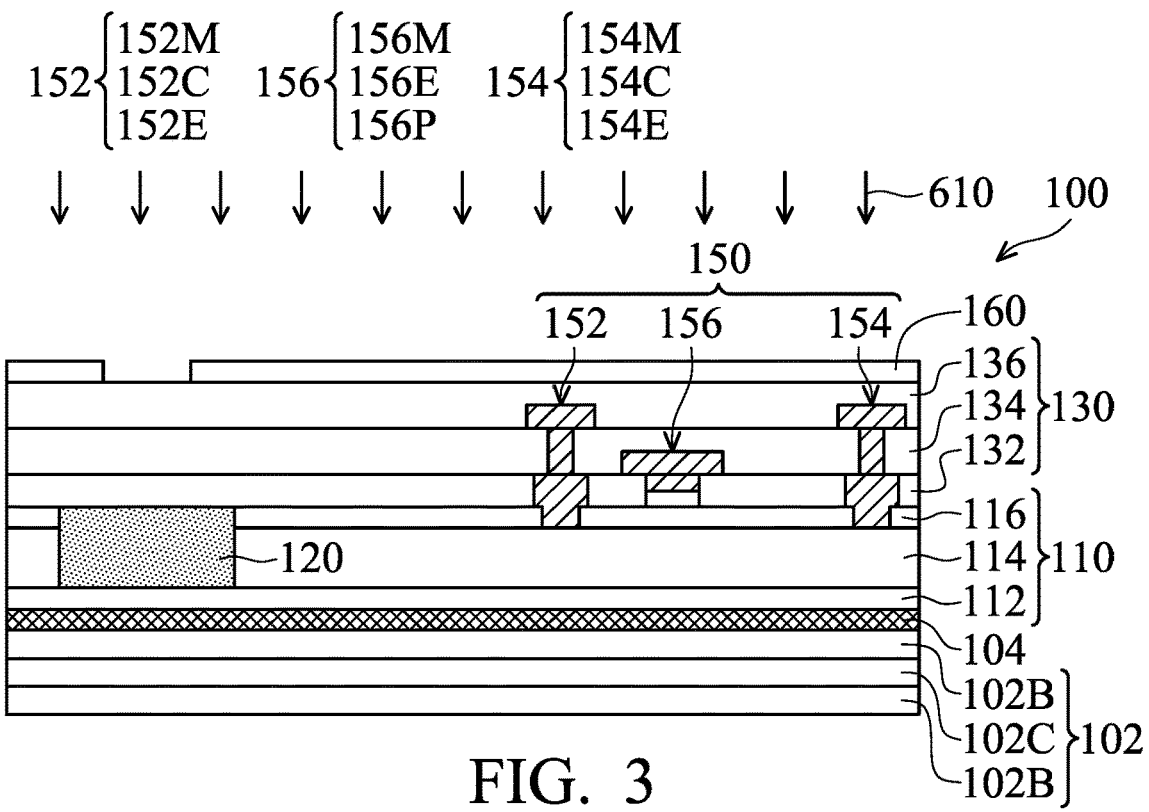

Next, referring to FIG. 2, an interlayer dielectric layer 130 (e.g. a first dielectric layer 132, a second dielectric layer 134, and a third dielectric layer 136) are formed on the epitaxial layer 110, and a first transistor 150 is formed in the interlayer dielectric layer 130. In some embodiments, the first transistor 150 may be a high electron mobility transistor (HEMT).

In some embodiments, the first transistor 150 includes a first gate structure 156, and a first source structure 152 and a first drain structure 154 formed on opposite sides of the first gate structure 156, respectively.

In some embodiments, the first gate structure 156 includes a first gate electrode 156E and a first gate metal layer 156M, wherein the first gate electrode 156E is formed on the barrier layer 116 and the first gate metal layer 156M is formed on and electrically connected to the first gate electrode 156E. In other embodiments, an optional first doped compound semiconductor layer 156P may be formed between the first gate electrode 156E and the barrier layer 116. The details will be further described later.

In some embodiments, the first source structure 152 includes a first source electrode 152E, a first source contact 152C, and a first source metal layer 152M which are electrically connected to each other, and the first drain structure 154 includes a first drain electrode 154E, a first drain contact 154C, and a first drain metal layer 154M which are electrically connected to each other. In some embodiments, the first source electrode 152E and the first drain electrode 154E on opposite sides of the first gate electrode 156E penetrating through the barrier layer 116 and contact the channel layer 114.

In some embodiments, the material of the first gate electrode 156 may be conductive materials, such as metal, metal nitride, or semiconductor materials. In some embodiments, the metal materials may be Au, Ni, Pt, Pd, Ir, Ti, Cr, W, Al, Cu, the like, a combination thereof, or multilayers thereof. The semiconductor materials may be polycrystalline silicon or polycrystalline germanium. The conductive material may be formed on the barrier layer 116 by chemical vapor deposition (CVD), sputtering, resistive thermal evaporation process, electron beam evaporation process, or other suitable deposition processes, and a patterning process is performed on the conductive material to form the first gate electrode 156E.

In some embodiments, before the formation of the first gate electrode 156E, the first doped compound semiconductor layer 156P may be formed on the barrier layer 116, and the first gate electrode 156E is formed on the first doped compound semiconductor layer 156P subsequently. The generation of 2DEG under the first gate electrode 156E can be inhibited by the first doped compound semiconductor layer 156P between the first gate electrode 156E and the barrier layer 116 so as to attain a normally-off status of the semiconductor structure 100. In some embodiments, the material of the first doped compound semiconductor layer 156P may be GaN which is doped with a p-type dopant or an n-type dopant. The steps of forming the first doped compound semiconductor layer 156P may include depositing a doped compound semiconductor layer (not shown) on the barrier layer 116 by using an epitaxial growth process, and performing a patterning process on the doped compound semiconductor layer to form the first doped compound semiconductor layer 156P corresponding to the predetermined position where the first gate electrode 156E is to be formed.

The material of the first source electrode 152E and the first drain electrode 154E which are formed on opposite sides of the first gate electrode 156E may be substantially the same as the material of the first gate electrode 156E. The details are not described again herein to avoid repetition. In some embodiments, as shown in FIG. 2, the first source electrode 152E and the first drain electrode 154E both penetrate through the barrier layer 116 and contact the channel layer 114.

In some embodiments, the first gate metal layer 156M, the first source contact 152C, the first source metal layer 152M, the first drain contact 154C, and the first drain metal layer 154M may be formed by a deposition process and a patterning process. The material of the first gate metal layer 156M, the first source contact 152C, the first source metal layer 152M, the first drain contact 154C, and the first drain metal layer 154M may include conductive materials, such as aluminium (Al), copper (Cu), tungsten (W), titanium (Ti), tantalum (Ta), titanium nitride (TiN), tantalum nitride (TaN), nickel silicide (NiSi), cobalt silicide (CoSi), tantalum carbide (TaC), tantalum silicide nitride (TaSiN), tantalum carbide nitride (TaCN), titanium aluminide (TiAl), titanium aluminide nitride (TiAlN), metal oxides, metal alloys, other suitable conductive materials, or a combination thereof.

In some embodiments, as shown in FIG. 2, the first gate electrode 156E is formed in the first dielectric layer 132 on the barrier layer 116, and the first gate metal layer 156M above the first dielectric layer 132 and embedded in the second dielectric layer 134 which is formed on the first dielectric layer 132. Furthermore, the first source contact 152C and the first drain contact 154C on opposite sides of the first gate structure 156 both penetrate through the second dielectric layer 134 on the epitaxial layer 110 and contact the first source electrode 152E and the first drain electrode 154E, respectively. The first source metal layer 152M and the first drain metal layer 154M are formed on the second dielectric layer 134 and embedded in the third dielectric layer 136 and are electrically connected to the first source contact 152C and the first drain contact 154C, respectively.

In some embodiments, the first dielectric layer 132, the second dielectric layer 134, and the third dielectric layer 136 may include a single layer or multi-layers of dielectric materials, such as silicon oxide, silicon nitride, silicon oxynitride, tetraethoxysilane (TEOS), phosphosilicate glass (PSG), borophosphosilicate glass (BPSG), low-k dielectric materials, and/or other suitable dielectric materials. The low-k dielectric materials may include fluorinated silica glass (FSG), hydrogen silsesquioxane (HSQ), carbon-doped silicon oxide, amorphous fluorinated carbon, parylene, bis-benzocyclobutenes (BCB), or polyimide, but not limited thereto.

In some embodiments, a deposition process, such as spin coating, chemical vapor deposition (CVD), physical vapor deposition (PVD), atomic layer deposition (ALD), high density plasma CVD (HDPCVD), other suitable methods, or a combination thereof, may be used to deposit the dielectric materials on the epitaxial layer 110 (e.g. the barrier layer 116) and the isolation structure 120 to form the first dielectric layer 132, the second dielectric layer 134, and the third dielectric layer 136.

Next, FIGS. 3-9 are cross-sectional views illustrating the methods for forming a through hole 170, a conductive liner 172, a dielectric pillar 174 according to some embodiments of the present disclosure. First, referring to FIG. 3, a patterned mask 160 is formed on the interlayer dielectric layer 130.

In an embodiment, the patterned mask 160 may be a patterned photoresist layer. In this embodiment, the patterned mask 160 is formed by a lithography process. The lithography process includes photoresist coating, pre-baking, exposure by masks, development, and the like.

In other embodiment, the patterned mask 160 may be a hard mask layer, which includes oxide, oxynitride, other suitable dielectric materials and the like. In this embodiment, the patterned mask 160 may be formed by forming a hard mask layer through the deposition process and then patterning the hard mask layer through a patterning process (e.g. lithography and etching process). The deposition process includes spin-on coating, CVD (e.g. HDPCVD), PVD, ALD, other suitable process, or a combination thereof.

Figure 4:
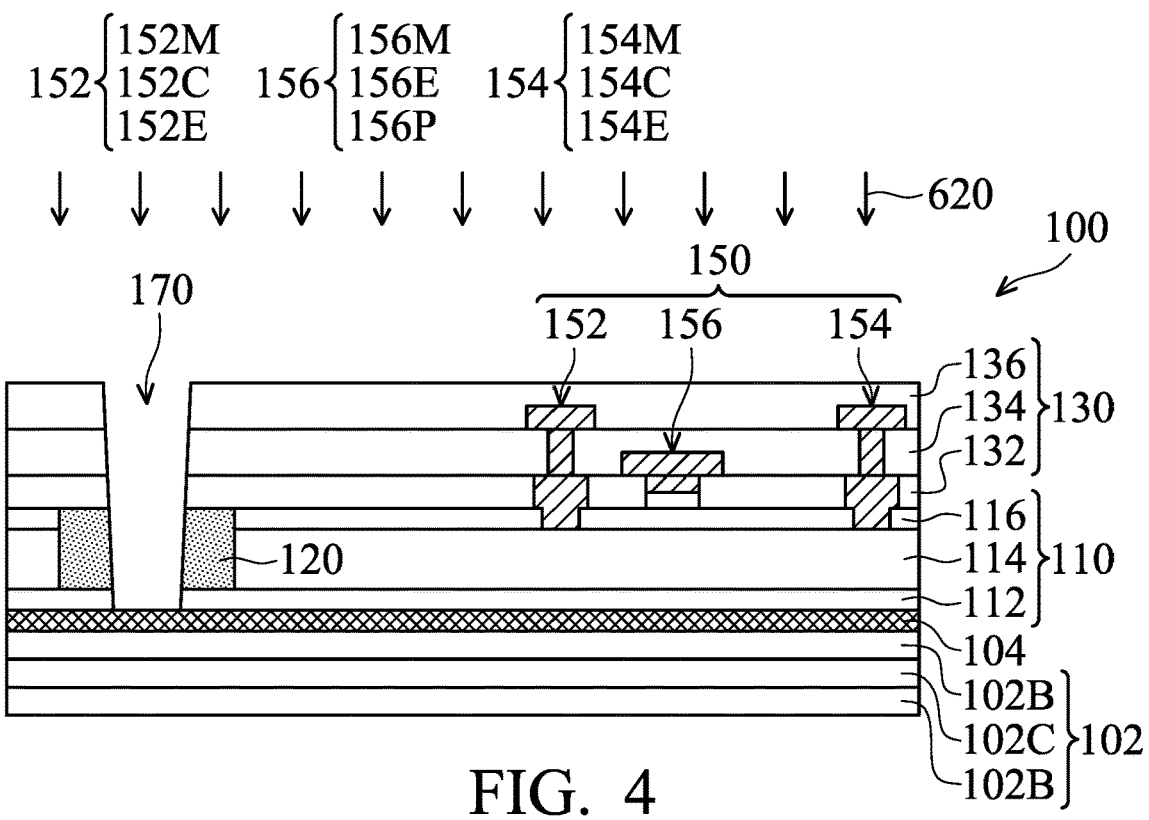

Next, the patterned mask 160 is used to etch through the interlayer dielectric layer 130 and the epitaxial layer 110 by an etching process 610 to expose a portion of the surface of the seed layer 104 so as to form a through hole 170 and then the patterned mask 160 is removed, as shown in FIG. 4. In an embodiment, the through hole 170 further penetrates through the isolation structure 120, so that the isolation structure 120 is separated on opposite sides of the through hole 170. That is, the isolation structure 120 is around the through hole 170. In some embodiments, the etching process 610 may include a wet etching process, a dry etching process, other suitable etching process (e.g. a reactive ion etching (RIE)) or a combination thereof or the like. In some embodiments, the patterned mask 160 may be removed by stripping, ashing, other suitable removal process, or a combination thereof, or the like.

Figure 5:
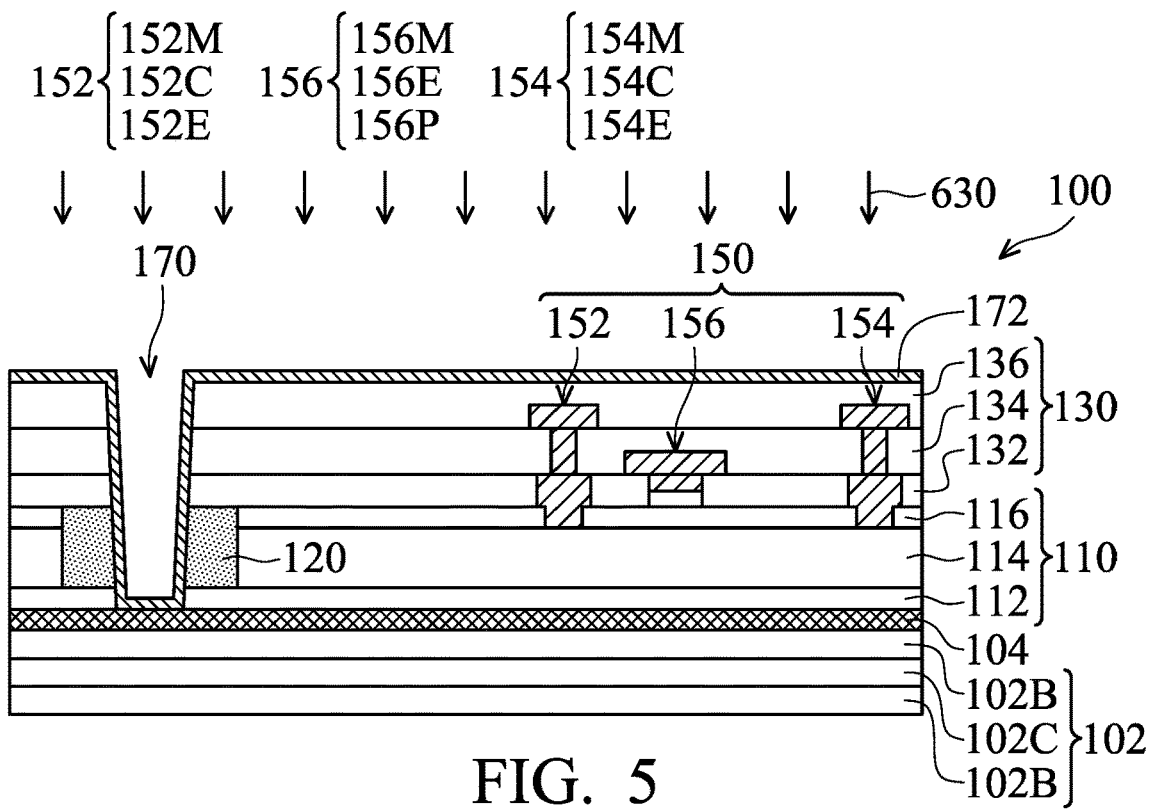

Next, the conductive liner 172 is deposited conformally in the through hole 170 and on the interlayer dielectric layer 130 by a conformal deposition process 620, as shown in FIG. 5. In FIG. 5, the conductive liner formed on the bottom and sidewalls of the through hole 170 and on the interlayer dielectric layer 130.

In an embodiment, materials of the conductive liner 172 may be Ti, TiN, Ta, TaN, W, Al, doped polycrystalline silicon, suitable conductive material, or the combination thereof, or the like. In some embodiments, the conformal deposition process 620 may include CVD, PECVD, ALD, sputter, MOCVD, the combination thereof, or the suitable process.

Figure 6:
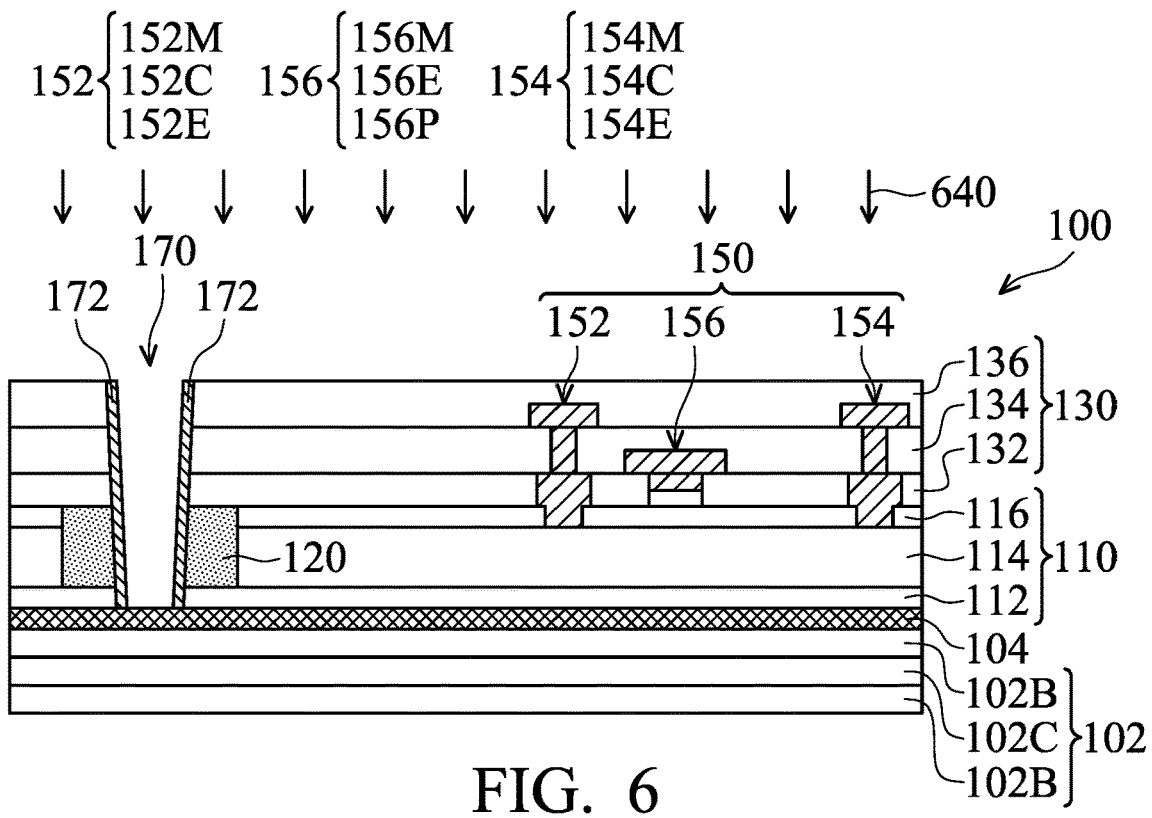

Next, the conductive liner 172 on the bottom of the through hole 170 and on the interlayer dielectric layer 130 is etched by an anisotropic etching process 630, and the conductive liners 172 on opposite sides of the through hole 170 remain unetched, as shown in FIG. 6. In an embodiment, the conductive liner 172 on sidewalls of opposite sides of the through hole 170 contact the seed layer 104 in order to draw charges in the seed layer 104. In an embodiment, the conductive liner 172 on the bottom of the through hole 170 is removed completely, in order to isolate opposite sides of the through hole 170 from electrically connecting each other in the subsequent structure. In an embodiment, the isolation structure 120 contacts the conductive liner 172.

Figure 7:
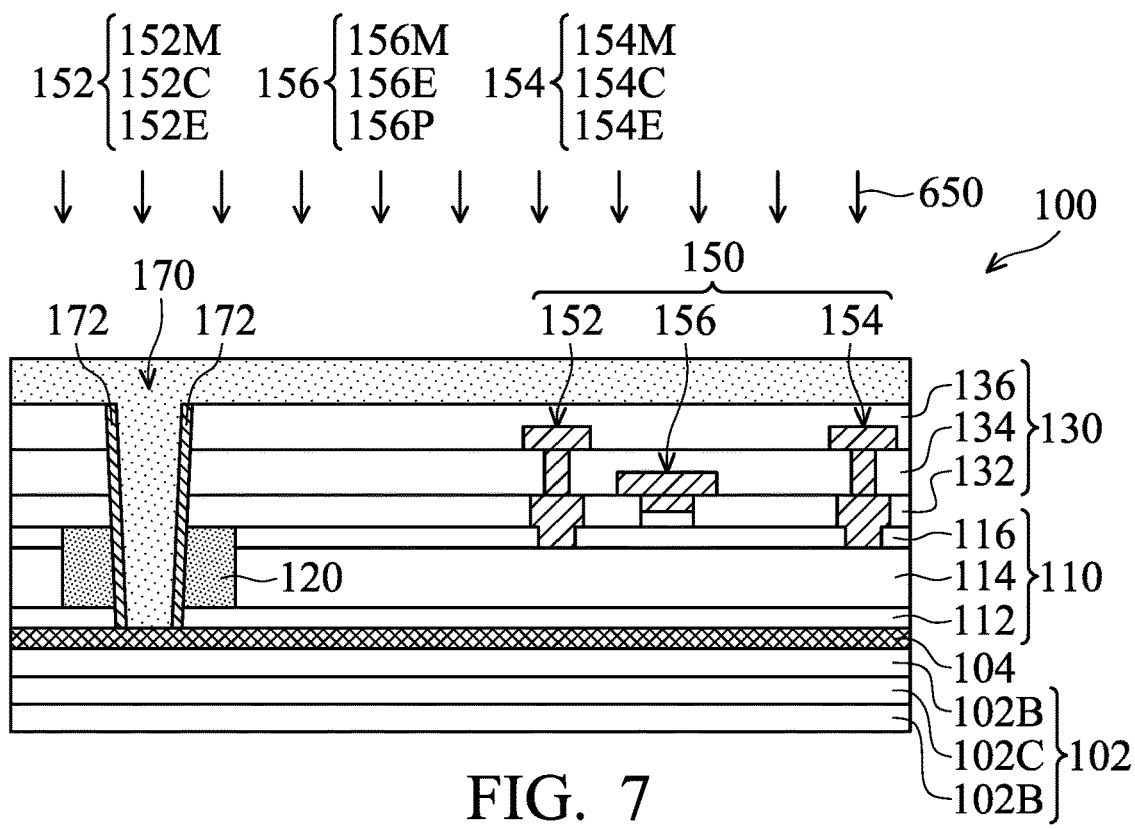

Next, the dielectric filler is deposited into the through hole and on the interlayer dielectric layer 130 using a deposition process 640, as shown in FIG. 7. In some embodiments, the deposition process may include spin-on coating, CVD (e.g. HDPCVD), PVD, ALD, the combination thereof, or other suitable process. In an embodiment, the dielectric filler may include silicon oxide, silicon nitride, silicon oxynitride, aluminum oxide, non-doped polycrystalline silicon, the combination thereof, or the suitable material, or the like.

Figure 8:
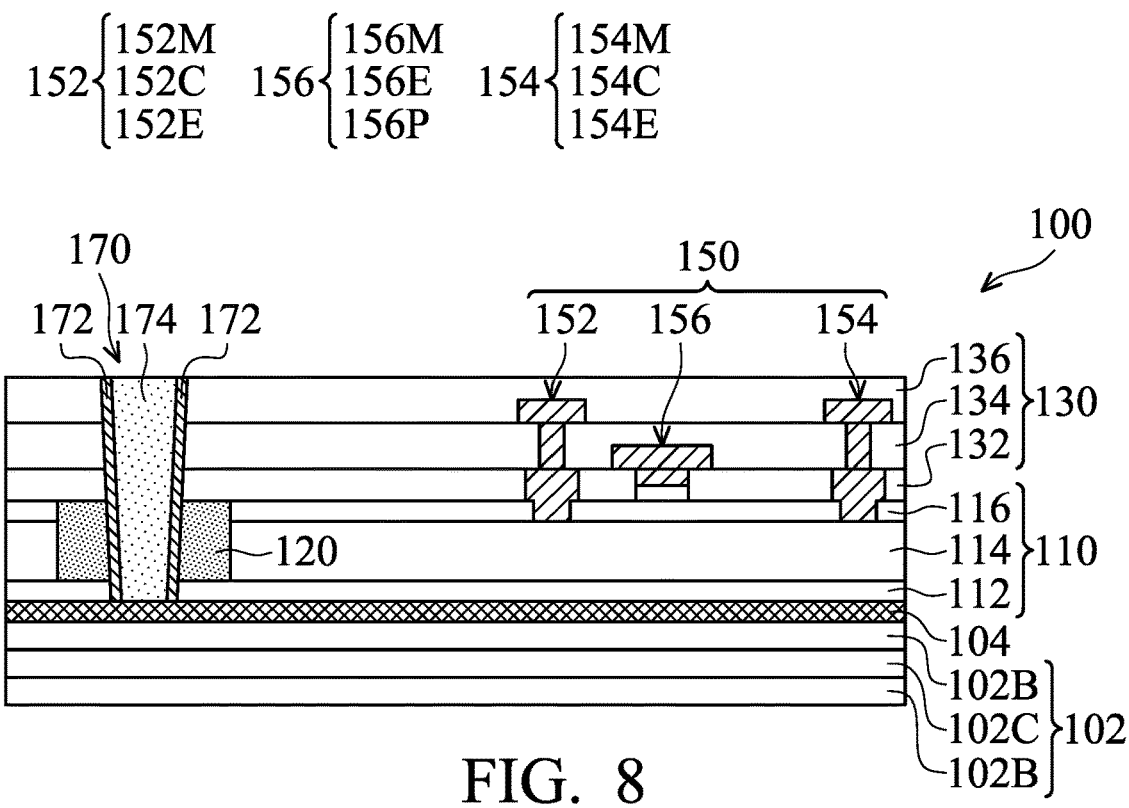

Next, the dielectric filler on the interlayer dielectric layer 130 is removed by a planarization process and/or back etching process 650 to form a dielectric pillar 174, as shown in FIG. 8. In some embodiments, the dielectric pillar 174 is formed between the conductive liner 172 on opposite sides of the through hole 170. In some embodiments, the bottom of the dielectric pillar 174 is not lower than that of the conductive liner 172. In some embodiments, the bottom of the dielectric pillar 174 is level with the bottom of the conductive liner 172. In some embodiments, the bottom of the dielectric pillar 174 contacts the seed layer 104 in order to isolate the conductive liner 172 on the sidewall near the first transistor 150 of the dielectric pillar 174 from the conductive liner 172 on the sidewall far from the first transistor 150 of the dielectric pillar 174 thereby preventing the conductive liner 172 on opposite sidewalls from electrically connecting.

In some embodiments, the planarization process 650 includes chemical mechanical polish (CMP) process. In this embodiment, upper surfaces of the interlayer dielectric layer 130, the conductive liner 172, and the dielectric pillar 174 are level with each other, as shown in FIG. 8. In some other embodiments, the dielectric filler on the interlayer dielectric layer 130 and portions of the interlayer dielectric layer 130 and the dielectric pillar 174 are etched, so that the conductive liner 172 extrudes slightly from the surface of the interlayer dielectric layer 130 (not shown).

In some embodiments, the width of the conductive liner 172 on opposite sides of the through hole 170 relative to the average width of the through hole 170 is about 1% to 10%. Due to the effect of the process, the etched through hole 170 becomes tapered downward. As a result, the through hole 170 has different widths at different depths, and thus the width of the dielectric pillar 174 is referred to the average width in the context. For example, the through hole 170 has a width about 1.2 μm at the widest position and has a width about 0.8 μm at the narrowest position, and thus the average width of the through hole 170 is about 1 μm and the width of the conductive liner 172 on opposite sides of the through hole 174 may be about 100 Alternatively, the through hole 170 has a width about 0.6 μm at the widest position and has a width about 0.4 μm at the narrowest position, and thus the average width of the through hole 170 is about 0.5 μm and the width of the conductive liner 172 on opposite sides of the through hole 174 may be about 300 Å. When the width of the conductive liner 172 on opposite sides of the through hole 174 relative to the average width of the through hole 170 is greater than 10%, the conductive liner 172 may be easily to electrically connect each other at the bottom of the through hole 170, so the device may short. On the contrary, when the width of the conductive liner 172 on opposite sides of the through hole 174 relative to the average width of the through hole 170 is less than 1%, the conductive liner 172 may be too thin to draw charges in the seed layer.

Next, back end processes including interconnect conductive lines may be performed on the first source structure 152, the first drain structure 154, the first gate structure 156 and the conductive liner 172. In some embodiments, the first source structure 152 further includes the first source contact 152C on the first source metal layer 152M, the first drain structure 154 further includes the first drain contact 154C on the first drain metal layer 154M, and the first gate structure 156 further includes a first gate contact 156C on the first gate metal layer 156M. The materials and the process of the first source contact 156C, the first drain contact 154C, and the first gate contact 156C formed in this embodiments are similar with the above, and thus are not described again herein to avoid repetition.

In some embodiments, a metal layer 182 is further formed on the first source contact 152C, a metal layer 184 is further formed on the first drain contact 154C, and a metal layer 186 is further formed on the first gate contact 156C. The materials and the process of the metal layer 182/184/182 (or referred to a first metal layer 180) formed in this embodiment are similar with that of the first source metal layer 152M, the first drain metal layer 154M, and the first gate metal layer 156M, and thus are not described again herein to avoid repetition.

In some embodiments, the metal layer 182 is electrically connected to the conductive liner 172 and the first transistor 150, in order to pass electrical current through the first transistor 150 when the switch is on, and draw charges in the seed layer 104 when the switch is off. In some embodiments, as the metal layer 182 is electrically connected to the conductive liner 172 and the first source structure 152, the first source structure 152 has the same potential as the seed layer 104, and thus may be used as ground.

The dielectric pillar with the conductive liner provided by the present disclosure may achieve isolating the electrical property of devices at both sides without increasing the chip area, and also ensure the grounding potential with the relatively simple process and low cost.

Comparing to the two devices are connected by wire bonding, the two devices may be connected by the interconnected metal line. In this way, not only parasitic inductance may be reduced, but also the availability of the operation in high frequency may be achieved. A skilled person may change and adjust the arrangement depending on required, and the present disclosure is not limited thereto.

Therefore, the dielectric pillar 174 with the conductive liner 172 provided by the present disclosure may electrically isolate both sides of the through hole 170 without affecting the direction of the electrical current when the switch is on and draw charges in the seed layer 104 to the circuit to reduce the accumulation of charges in the seed layer 104.

Figure 9:
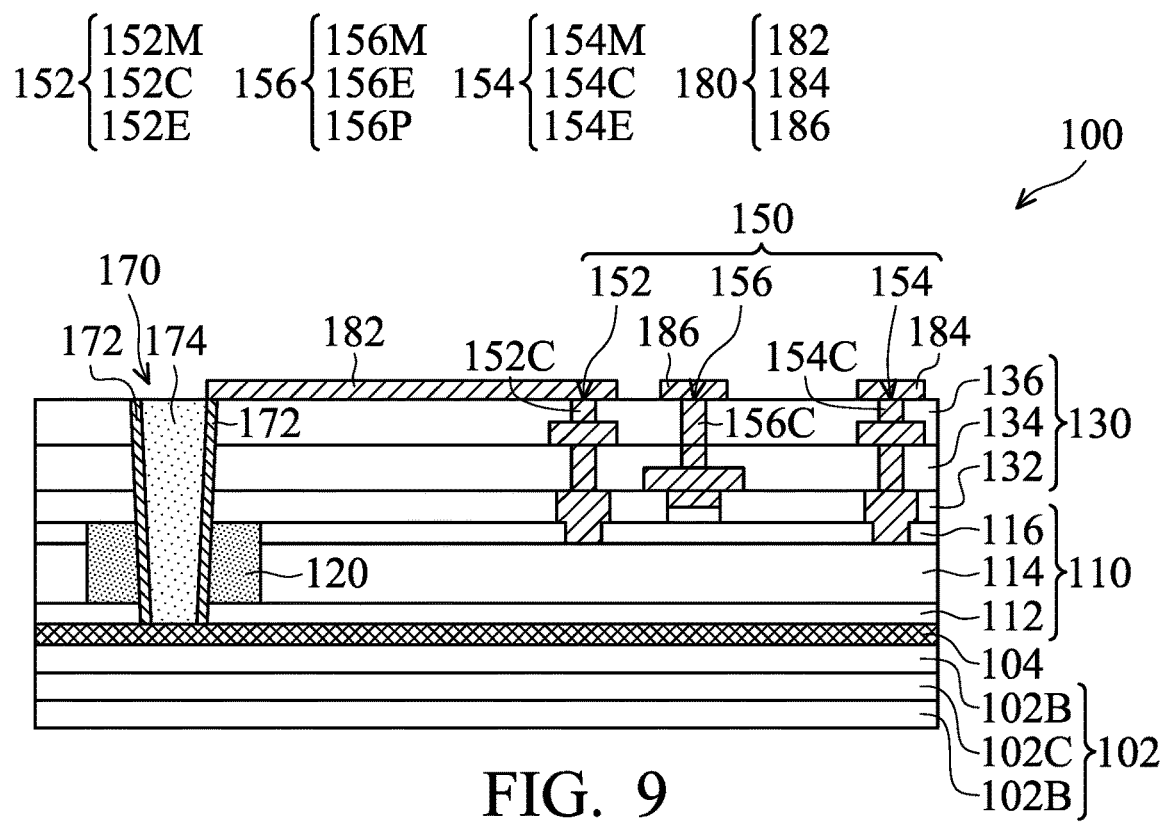
Figure 10:
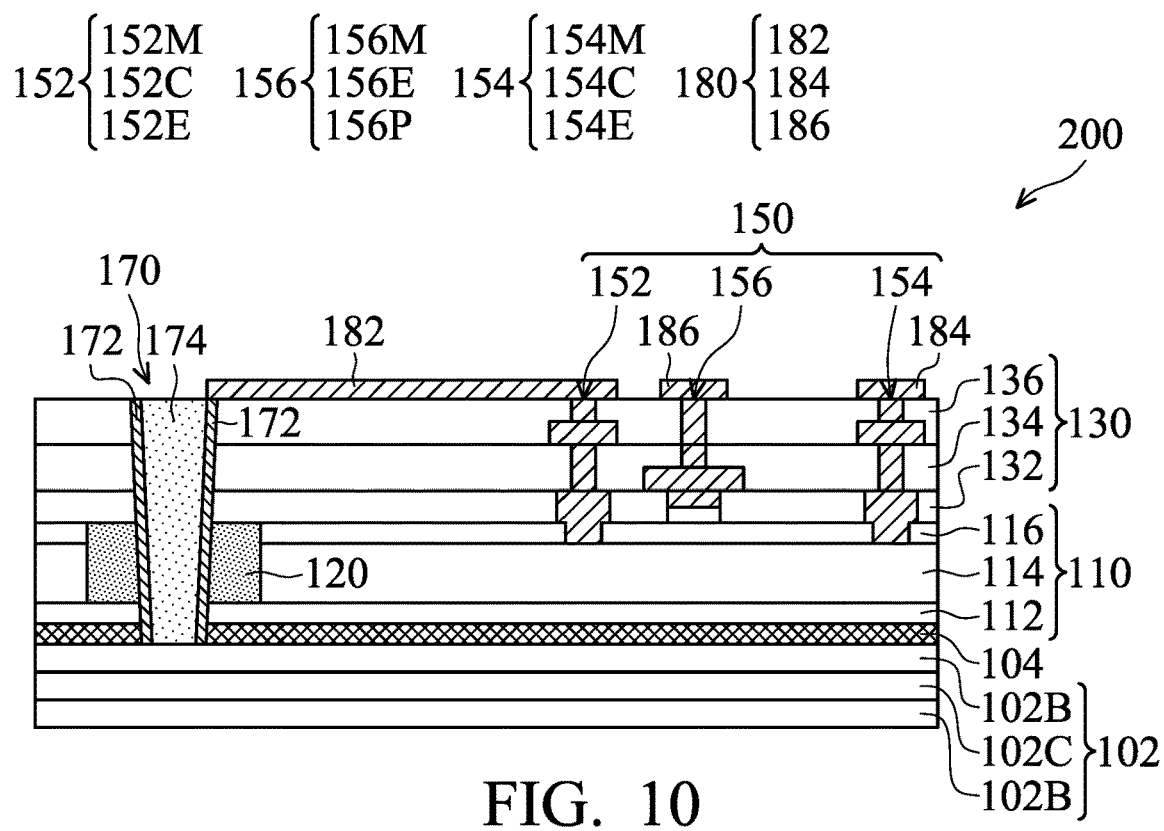
FIGS. 10-11 are cross-sectional views illustrating an exemplary semiconductor structure according to other embodiments of the present disclosure.
Figure 11:
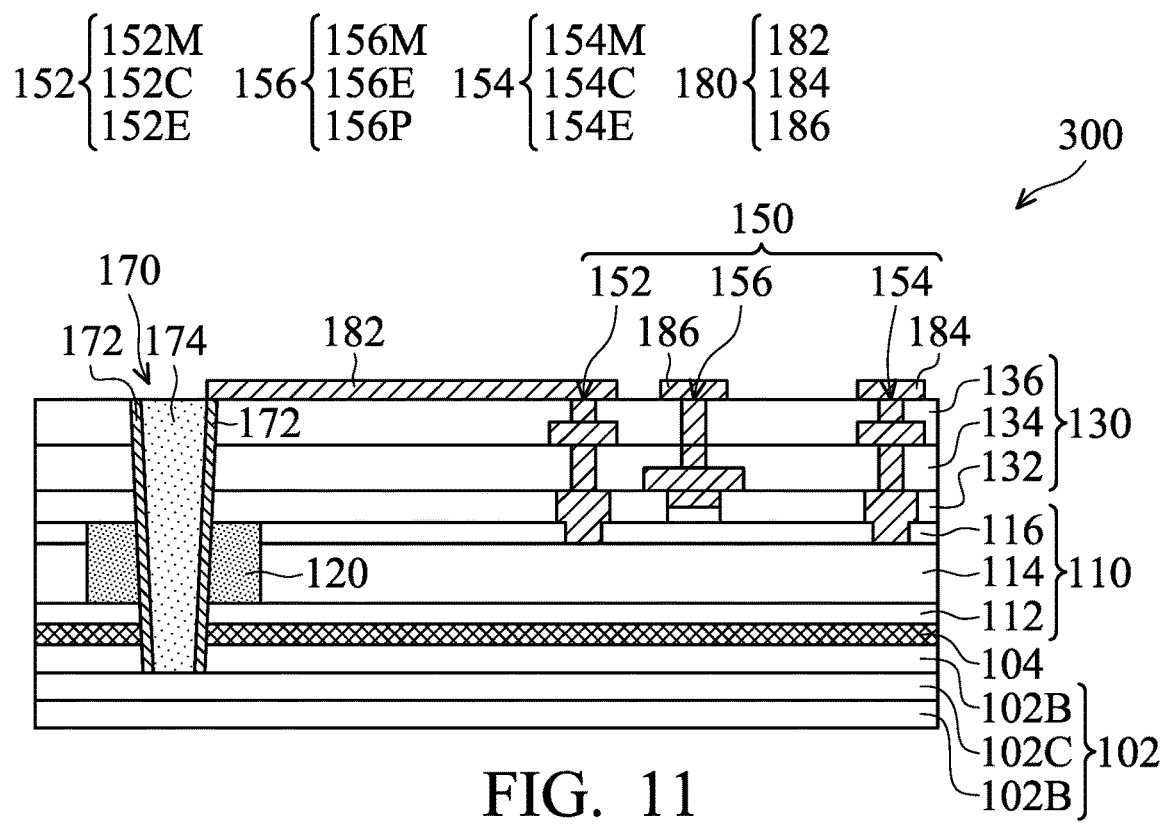

FIGS. 10-11 are cross-sectional views illustrating an exemplary semiconductor structure according to other embodiments of the present disclosure. The difference between the semiconductor structure 200 in FIG. 10 and the semiconductor structure 100 in FIG. 9 is that the through hole 170 further penetrates through the seed layer 104 and contacts the substrate 102. In this way, the contact area of the conductive liner 172 and the seed layer 104 may be increased and thus it is more easily to draw charges in the seed layer. The difference between the semiconductor structure 300 in FIG. 11 and the semiconductor structure 100 in FIG. 9 is that the through hole 170 further penetrates through the seed layer 104 and the blocking layer 102B of the substrate 102 and contacts the ceramic base material 102C of the substrate 102. In this way, the ceramic base material 102C may have additional path of thermal dissipation. The methods for forming the semiconductor structures 200 and 300 in FIG. 10 and FIG. 11 are similar to the method for forming the semiconductor structure 100 in FIG. 9, and thus are not described again herein to avoid repetition.

Figure 12:
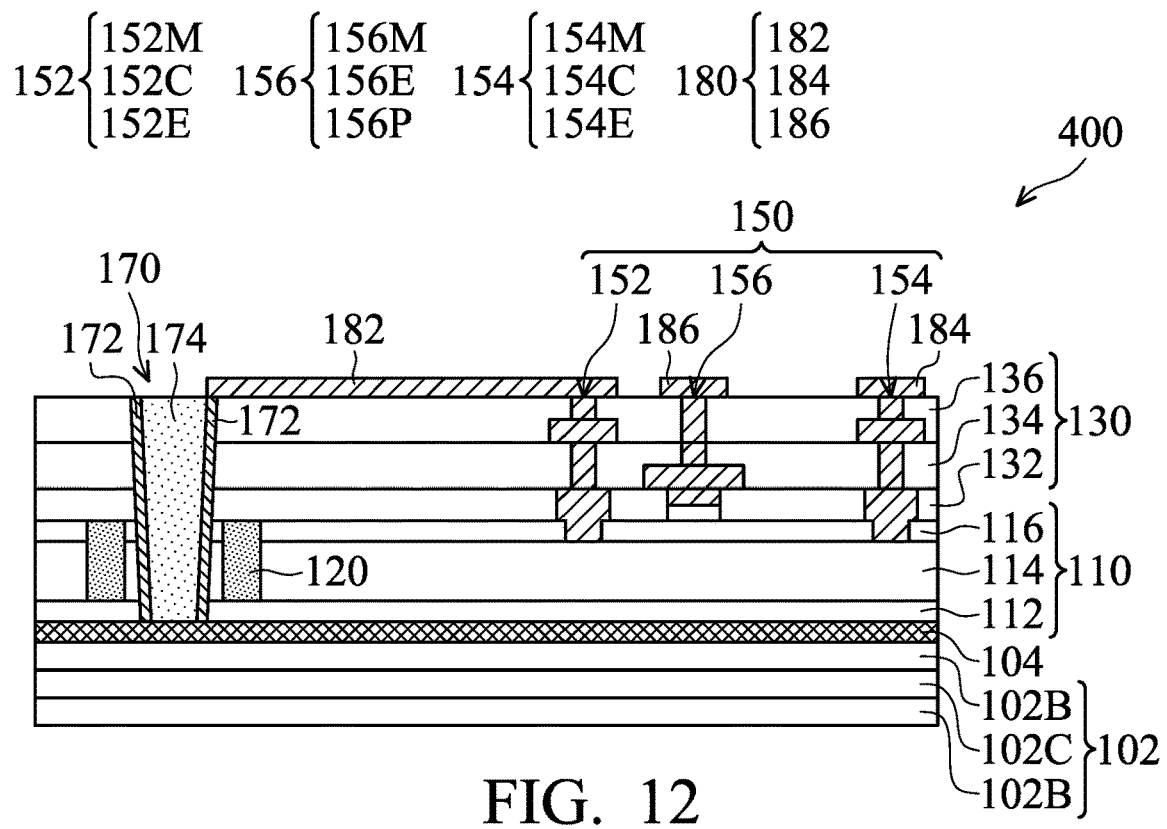
FIG. 12 is a cross-sectional view illustrating an exemplary semiconductor structure according to other embodiments of the present disclosure.

FIG. 12 is a cross-sectional view illustrating an exemplary semiconductor structure according to other embodiments of the present disclosure. The difference between the semiconductor structure 400 in FIG. 12 and the semiconductor structure 100 in FIG. 9 is that the isolation structure 120 is disposed between the conductive liner 172 and the first transistor 150. Specifically, the isolation structure 120 does not contact the conductive liner 172 in order to prevent the 2DEG from connecting the first transistor 150 and the conductive liner 172 and thus shorting. The method for forming the semiconductor structures 400 in FIG. 12 is similar to the method for forming the semiconductor structure 100 in FIG. 9, and thus is not described again herein to avoid repetition.

Figure 13:
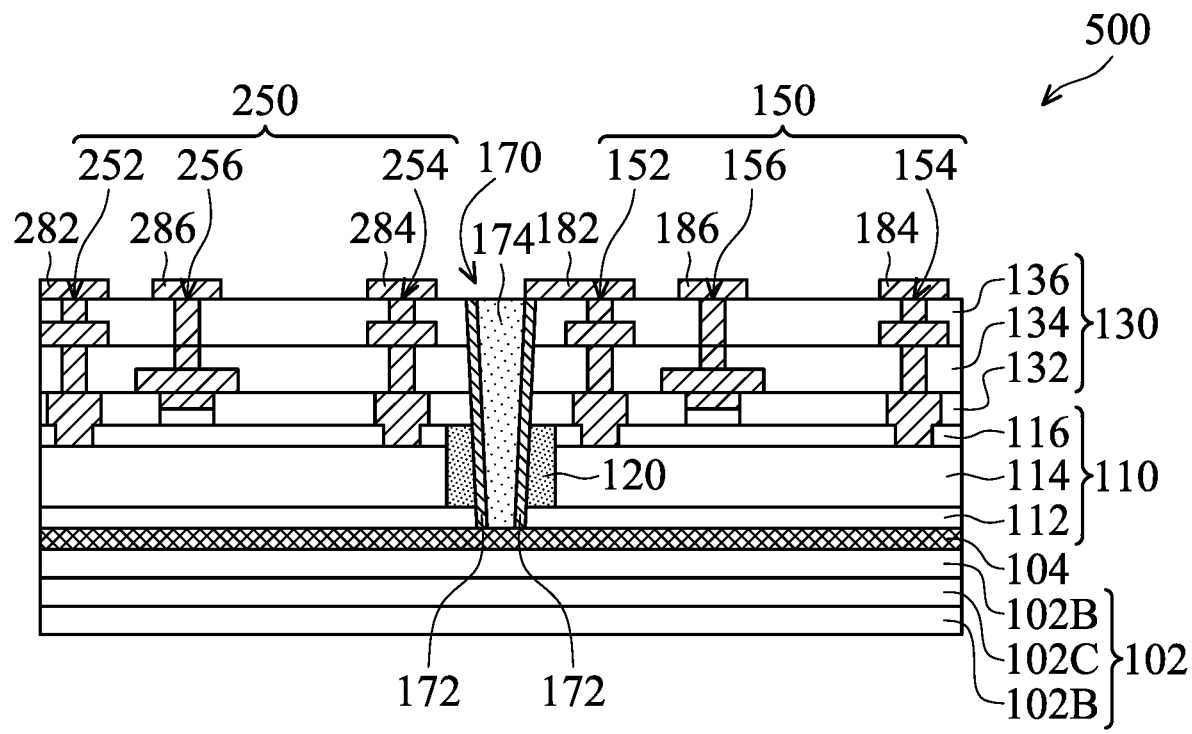
FIG. 13 is a cross-sectional view illustrating an exemplary semiconductor structure according to other embodiments of the present disclosure.
Figure 14:
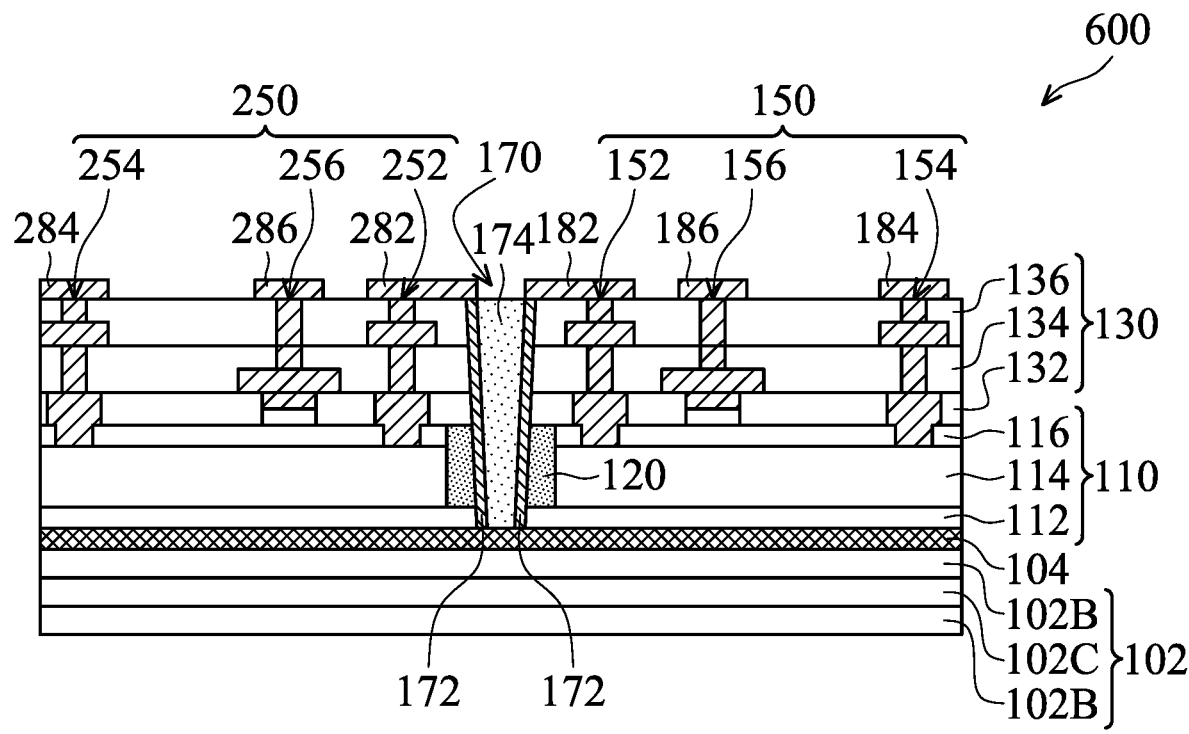
FIG. 14 is a cross-sectional view illustrating an exemplary semiconductor structure according to other embodiments of the present disclosure.

FIG. 13 and FIG. 14 are embodiments of integrating multiple devices. FIG. 13 is a cross-sectional view illustrating an exemplary semiconductor structure according to other embodiments of the integrating devices. The difference between the semiconductor structure 500 in FIG. 13 and the semiconductor structure 100 in FIG. 9 is that a second transistor 250 is further formed on the epitaxial layer 110 and at the side opposite the first transistor 150 of the dielectric pillar 174 and a second metal layer 280 is formed on the second transistor 250.

In the embodiment of FIG. 13, the second transistor 250, the dielectric pillar 174 with the conductive liner 172, and the first transistor 150 are disposed in sequence from left to right. Specifically, the formation the second transistor 250 includes the formation of the second gate structure 256, and the second drain structure 254 and the second source structure 252 on opposite sides of the second gate structure 256, wherein the second drain structure 254 is near the conductive liner 172. The formation and the materials of the second transistor 250 are similar to the first transistor 150, and thus are not described again herein to avoid repetition.

In the embodiment of FIG. 13, a metal layer 282 is formed on the second source structure 252, a metal layer 286 is formed on the second gate structure 256, and a metal layer 284 is formed on the second source structure 254. The materials and the formation of the metal layer 282/284/286 (or referred to a second metal layer 280) are similar to the first metal layer 180 in FIG. 9, and thus are not described again herein to avoid repetition.

In an embodiment, the second metal layer 280 merely span over the second transistor 250 without connecting one end of the conductive liner 172. In an embodiment, the metal layer 284 formed on the second drain source 254 does not electrically connect the conductive liner 172. In this way, the first transistor 150 and the second transistor 250 have independently electrical property respectively, thereby drawing charges from the seed layer without affecting each other and enhancing performance of the semiconductor structure.

FIG. 14 is a cross-sectional view illustrating an exemplary semiconductor structure according to other embodiments of the integrating devices. The difference between the semiconductor structure 600 in FIG. 14 and the semiconductor structure 500 in FIG. 13 is that the arrangement of the second transistor 250 and the second metal layer 280. Specifically, the second source structure 252 and the metal layer 282 on the second source structure 252 is near the conductive liner 172, and the second drain structure 254 and the metal layer 284 on the second drain structure 254 is far from the conductive liner 172.

In an embodiment, the second metal layer 280 spans over the conductive liner 172 and the second transistor 250 and connects one end of the conductive liner 172. In this embodiment, the second metal layer 282 on the second source structure 252 electrically connects to the conductive liner 172. In this way, the first source structure 152 and the second source structure 252 both electrically connect the seed layer 104 and have the same potential. In this embodiment, the first metal layer 180 and the second metal layer 280 on opposite sides of the through hole 170 both electrically connect to the conductive liner 172. In this way, it is easily to draw charges from the seed layer to enhance the performance of the semiconductor structure.

In addition, in some embodiments, the dielectric pillar 174 with the conductive liner 172 may surround the transistor (not shown). In the top view of this embodiment, the conductive liner 172 near the transistor may electrically connect the source structure of the transistor by the metal layer, and the conductive liner 172 far from the transistor may electrically connect the source structure of another transistor by another metal layer or may merely ground. A skilled person may change and adjust the arrangement depending on required, and the present disclosure is not limited thereto.

The semiconductor structure provided by the present disclosure, which includes the dielectric pillar 174 and the conductive liner 172 on the sidewall of the dielectric pillar 174, not only reduces the charge accumulation in the seed layer, but also has the function of isolation to improve the performance of the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a seed layer on the substrate;
an epitaxial layer on the seed layer;
a first transistor on the epitaxial layer;
an interlayer dielectric layer on the epitaxial layer;
a dielectric pillar penetrating through the interlayer dielectric layer and the epitaxial layer; and
a conductive liner disposed on a sidewall of the dielectric pillar, wherein the conductive liner is electrically connected to the first transistor and the seed layer.

2. The semiconductor structure as claimed in claim 1, further comprising a first metal layer electrically connected to the conductive liner and the first transistor.

3. The semiconductor structure as claimed in claim 2, wherein the first metal layer is electrically connected to the conductive liner and a first source structure of the first transistor.

4. The semiconductor structure as claimed in claim 1, wherein the conductive liner is further disposed on another sidewall opposite the sidewall of the dielectric pillar.

5. The semiconductor structure as claimed in claim 4, further comprising:
a second transistor on the epitaxial layer and adjacent to the another sidewall of the dielectric pillar; and
a second metal layer spans over the conductive liner and the second transistor, wherein the second metal layer is connected to one end of the conductive liner on the another sidewall.

6. The semiconductor structure as claimed in claim 5, wherein the second metal layer is electrically connected to the conductive liner and a second source structure of the second transistor.

7. The semiconductor structure as claimed in claim 1, wherein a bottom of the dielectric pillar is not lower than a bottom of the conductive liner.

8. The semiconductor structure as claimed in claim 1, wherein the dielectric pillar further penetrates through the seed layer and contacts the substrate.

9. The semiconductor structure as claimed in claim 1, further comprising an isolation structure around the dielectric pillar.

10. The semiconductor structure as claimed in claim 1, wherein the first transistor is a high electron mobility transistor (HEMT).

11. A method for forming a semiconductor structure, comprising:
providing a substrate;
forming a seed layer on the substrate;
forming an epitaxial layer on the seed layer;
forming a first transistor on the epitaxial layer;
forming an interlayer dielectric layer on the epitaxial layer and covering the first transistor;
forming a through hole penetrating through the interlayer dielectric layer and the epitaxial layer to expose a portion of a surface of the seed layer;
forming a conductive liner on a sidewall of the through hole, wherein the conductive liner is electrically connected to the first transistor and the seed layer; and
filling the through hole with a dielectric filler to form a dielectric pillar.

12. The method as claimed in claim 11, wherein the formation of the conductive liner comprises:
forming the conductive liner on a bottom and sidewalls of the through hole and on the interlayer dielectric layer; and
removing the conductive liner on the bottom of the through hole and on the interlayer dielectric layer.

13. The method as claimed in claim 11, further comprising forming a first metal layer after forming the dielectric pillar, wherein the first metal layer is electrically connected to the conductive liner and the first transistor.

14. The method as claimed in claim 13, wherein the first metal layer is electrically connected to the conductive liner and a first source structure of the first transistor.

15. The method as claimed in claim 11, wherein the formation of the conductive liner further comprises forming the conductive liner on another sidewall opposite the sidewall of the through hole.

16. The method as claimed in claim 15, further comprising:
- forming a second transistor on the epitaxial layer and adjacent to the another sidewall of the dielectric pillar; and
- forming a second metal layer after forming the dielectric pillar, wherein the second metal layer spans over the conductive liner and the second transistor, and is connected to one end of the conductive liner on the another sidewall.

17. The method as claimed in claim 16, wherein the second metal layer is electrically connected to the conductive liner and a second source structure of the second transistor.

18. The method as claimed in claim 11, wherein the through hole further penetrates through the seed layer to expose the substrate.

19. The method as claimed in claim 11, further comprising forming an isolation structure around the through hole before forming the interlayer dielectric layer.

20. The method as claimed in claim 19, wherein the isolation structure is formed by (i) breaking a crystal lattice structure of the epitaxial layer by applying external energy; (ii) implanting a non-conductive element into the epitaxial layer; or (iii) filling a dielectric material into the epitaxial layer.

* * * * *